(12) United States Patent
Kachi et al.

(10) Patent No.: US 11,776,999 B2
(45) Date of Patent: Oct. 3, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tsuyoshi Kachi, Nonoichi Ishikawa (JP); Tatsuya Nishiwaki, Komatsu Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 219 days.

(21) Appl. No.: 17/009,013

(22) Filed: Sep. 1, 2020

(65) Prior Publication Data

US 2021/0273051 A1 Sep. 2, 2021

(30) Foreign Application Priority Data

Feb. 28, 2020 (JP) ................. 2020-034118

(51) Int. Cl.
*H01L 29/06* (2006.01)
*H01L 29/423* (2006.01)
*H01L 29/78* (2006.01)

(52) U.S. Cl.
CPC ...... *H01L 29/0696* (2013.01); *H01L 29/4238* (2013.01); *H01L 29/42364* (2013.01); *H01L 29/7813* (2013.01)

(58) Field of Classification Search
CPC ........... H01L 29/0696; H01L 29/42364; H01L 29/4238; H01L 29/7813; H01L 29/1095; H01L 29/407; H01L 29/41766
See application file for complete search history.

(56) References Cited

U.S. PATENT DOCUMENTS

| 8,531,010 | B2 | 9/2013 | Oyu et al. |
| 11,239,357 | B2 | 2/2022 | Nishiwaki et al. |
| 2013/0009241 | A1* | 1/2013 | Matsuda ........... H01L 29/42372 257/329 |
| 2015/0349113 | A1 | 12/2015 | Katoh et al. |
| 2017/0213908 | A1* | 7/2017 | Fursin .................. H01L 29/407 |
| 2019/0097004 | A1* | 3/2019 | Ina ...................... H01L 29/0657 |
| 2019/0165160 | A1* | 5/2019 | Hutzler ............. H01L 29/66734 |

FOREIGN PATENT DOCUMENTS

JP 5061675 B2 10/2012

* cited by examiner

*Primary Examiner* — Jonathan Han
(74) *Attorney, Agent, or Firm* — Kim & Stewart LLP

(57) ABSTRACT

A semiconductor device includes a semiconductor layer, first and second electrodes, one or more gate electrodes, and an array of structures. The semiconductor layer has first and second sides opposite to each other in a first direction. The semiconductor layer is single crystal silicon. The array of structures is in the semiconductor layer and arranged in a second direction perpendicular to the first direction and along a [100] direction of the single crystal silicon and in a third direction that is perpendicular to the first direction and not perpendicular to the second direction. A first distance between first and second ones of the structures adjacent to each other in the third direction is less than a second distance between the first one and a third one of the structures adjacent to the first one in the second direction.

12 Claims, 17 Drawing Sheets

SEMICONDUCTOR DEVICE

CROSS-REFERENCE TO RELATED APPLICATION(S)

This application is based upon and claims the benefit of priority from Japanese Patent Application No. 2020-034118, filed on Feb. 28, 2020, the entire contents of which are incorporated herein by reference.

FIELD

Embodiments described herein relate generally to a semiconductor device.

BACKGROUND

Semiconductor devices such as a metal oxide semiconductor field effect transistor (MOSFET) are used for conversion of power, or the like. It is desirable that the on resistance of a semiconductor device be low.

DETAILED DESCRIPTION

Figure 1:
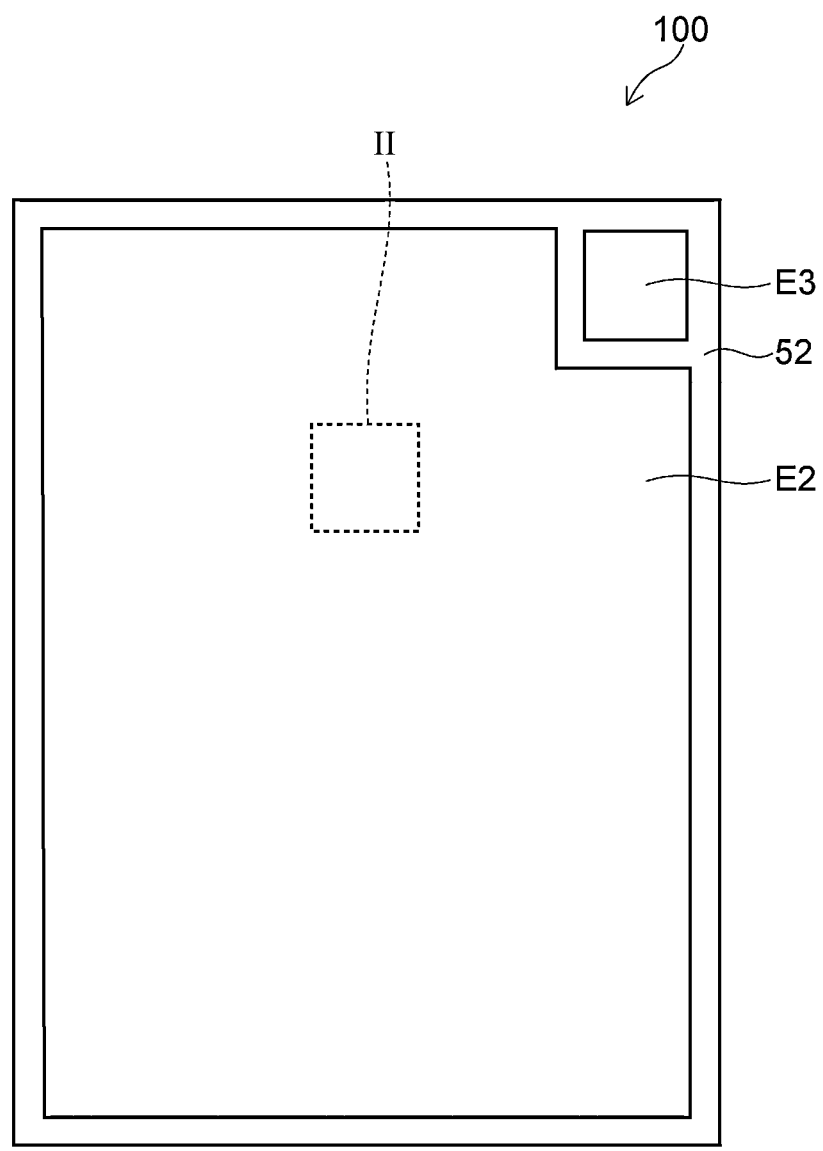
FIG. 1 is a plan view of a semiconductor device according to a first embodiment.

In general, according to an embodiment, a semiconductor device includes a semiconductor layer, a first electrode, a second electrode, an array of structures, and one or more gate electrodes. The semiconductor layer has first and second sides opposite to each other in a first direction. The semiconductor layer of single crystal silicon and includes a first region of a first conductivity type, a second region of a second conductivity type, and a third region of the first conductivity type in this order in the first direction from the first side to the second side. The first electrode is on the first side. The second electrode is on the second side. The array of structures is formed in the semiconductor layer and arranged in a second direction that is perpendicular to the first direction and along a [100] direction of the single crystal silicon and in a third direction that is perpendicular to the first direction and not perpendicular to the second direction. Each of the structures includes a conductive portion electrically connected to the second electrode and an insulating portion surrounding the conductive portion. A first distance between a first one of the structures and a second one of the structures adjacent to the first one in the third direction is less than a second distance between the first one and a third one of the structures adjacent to the first one in the second direction.

Hereinafter, certain example embodiments will be described with reference to the drawings.

The drawings are schematic or conceptual, and relationships between the thickness and width of portions, ratios of sizes among portions, and the like are not necessarily the same as the actual values thereof. Even for identical portions depicted in different drawings, different dimensions and ratios may be shown in the drawings.

In the specification and the drawings of the present disclosure, components substantially identical to those already described are represented by identical reference numerals, and repeated description thereof may be omitted as appropriate.

In the following description and drawings, the labels $n^+$, $n^-$, $p^+$, and $p^-$ represent a relatively high or low degree of concentration of each impurity type. That is, a symbol expressed with "+" shows that the impurity concentration is relatively higher than that of a symbol expressed without "+" or "−", and a symbol expressed with "−" shows that the impurity concentration is relatively lower than that of the symbol expressed without "+" or "−". When regions of these symbols each include both a p-type impurity and an n-type impurity, the symbols represent a relatively high or low degree of net impurity concentration that is obtained after the impurities offset each other.

Each embodiment in which p type and n type of each of semiconductor regions can be reversed with each other type in each of the following embodiments are possible.

First Embodiment

FIG. 1 is a plan view of a semiconductor device according to a first embodiment.

Figure 2:
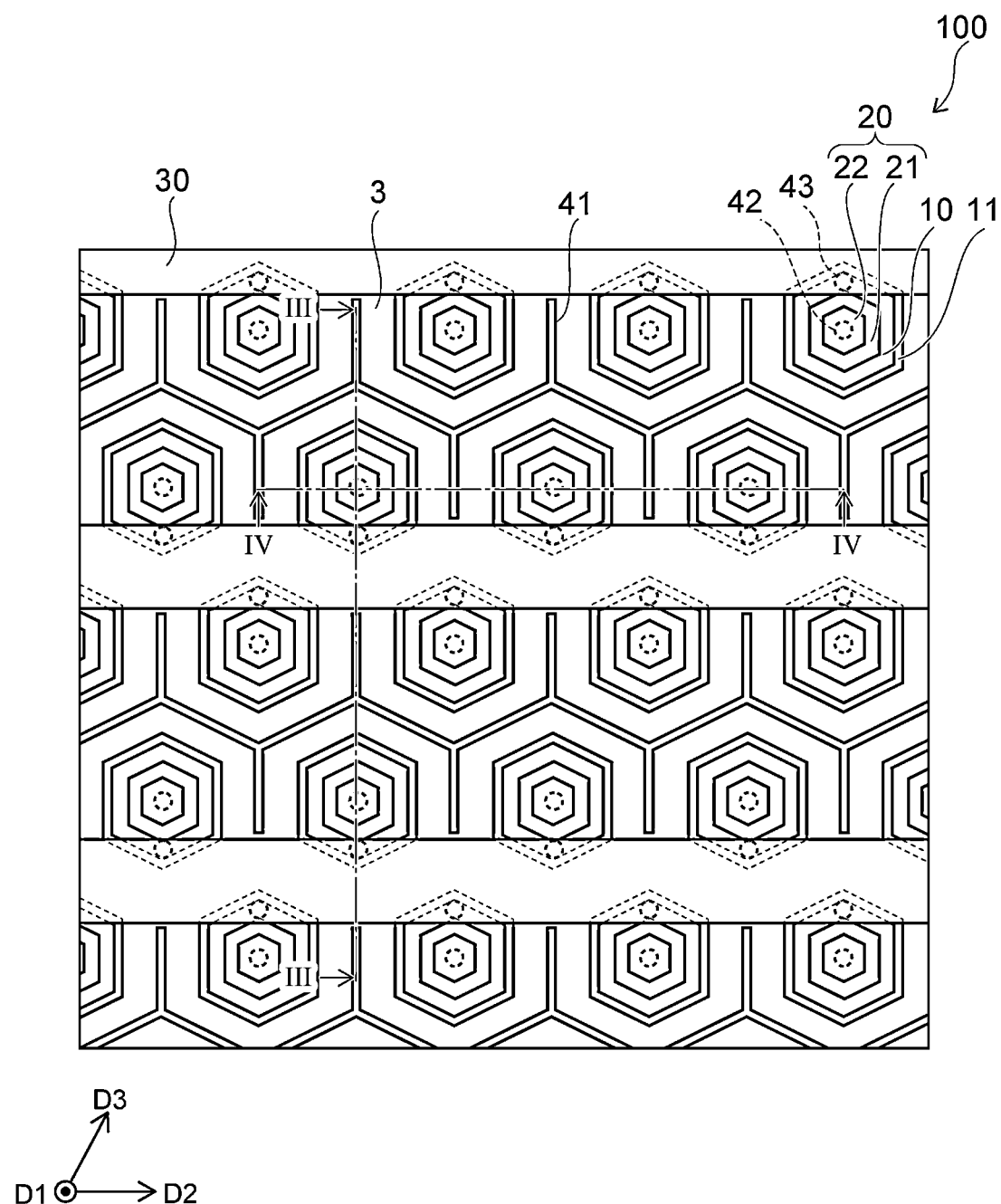
FIG. 2 is a plan view of part II of the semiconductor device illustrated in FIG. 1.

FIG. 2 is a plan view of a part II of the semiconductor device depicted in FIG. 1. In FIG. 2, a source electrode E2, an insulating layer 51, an insulating layer 52, and the like are omitted.

Figure 3:
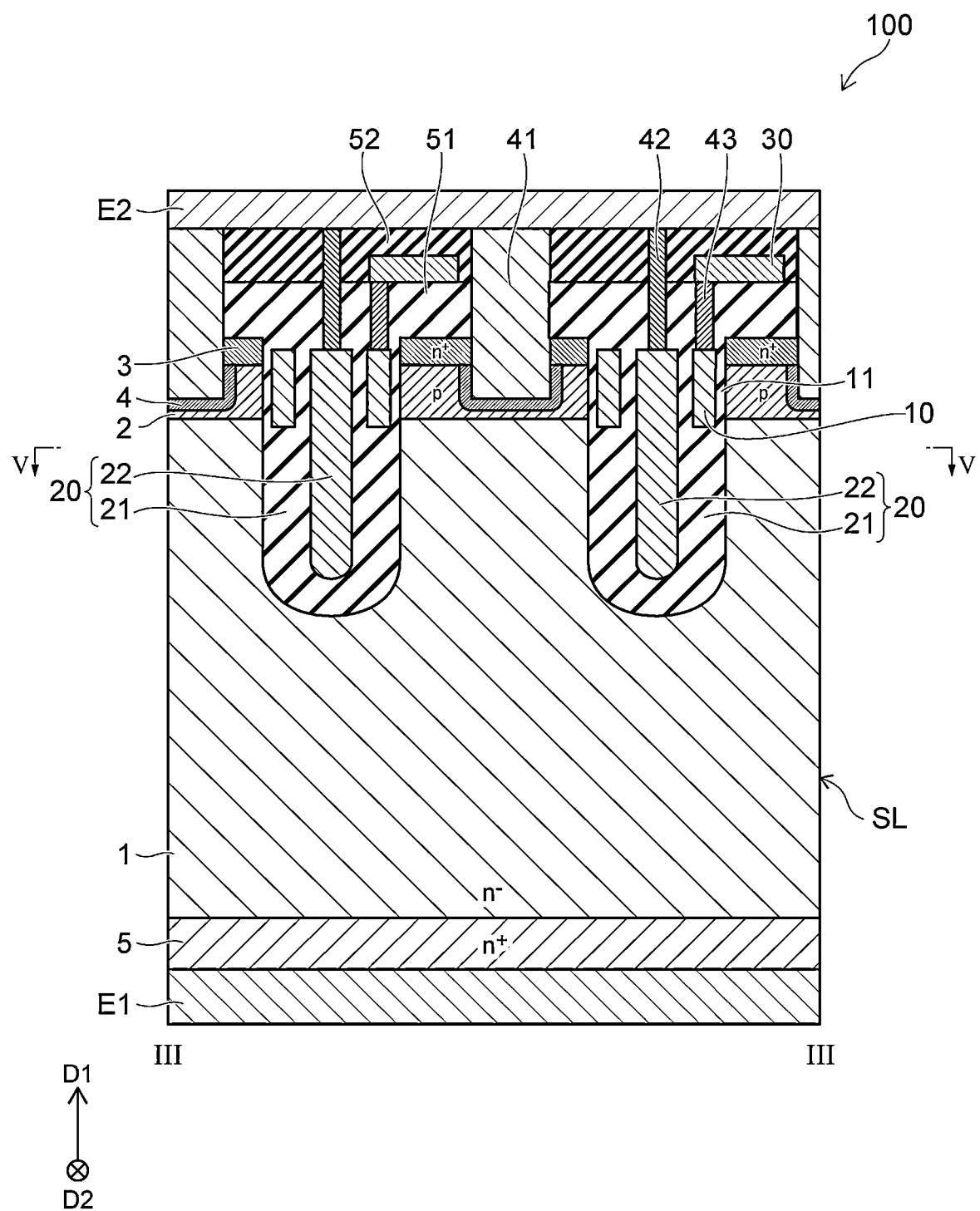
FIG. 3 is a cross-sectional view of the semiconductor device taken along a line III-III in FIG. 2.
Figure 4:
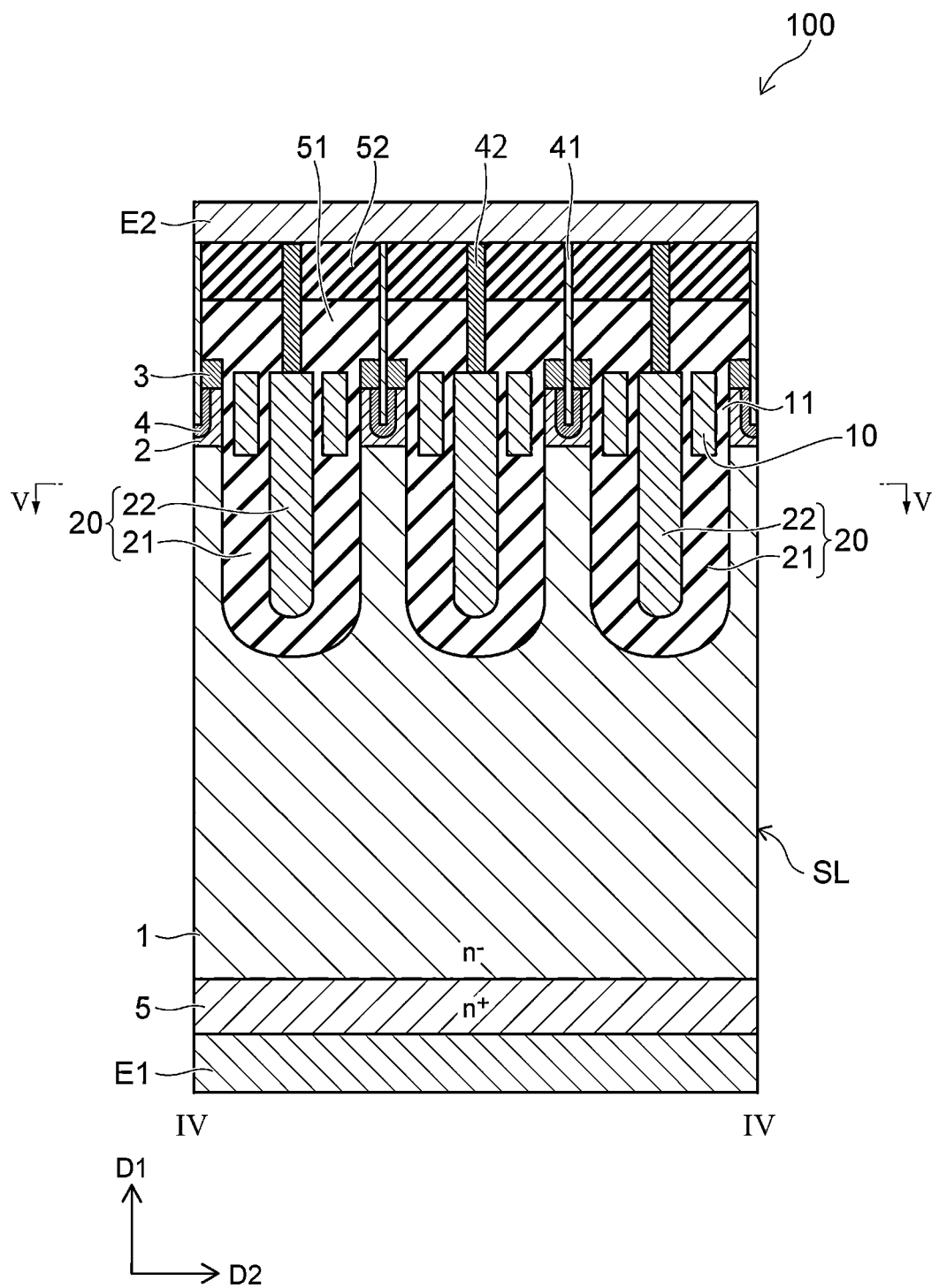
FIG. 4 is a cross-sectional view of a semiconductor device taken along a line IV-IV in FIG. 2.

FIG. 3 is a cross-sectional view of the semiconductor device taken along a line III-III in FIG. 2. FIG. 4 is a cross-sectional view of the semiconductor device taken along a line IV-IV in FIG. 2.

A semiconductor device 100 according to the first embodiment is MOSFET. As illustrated in FIGS. 1 to 4, the semiconductor device 100 according to the first embodiment includes a semiconductor layer SL, a drain electrode E1 (first electrode), a source electrode E2 (second electrode), and a gate pad E3 (third electrode).

In description of each of the following embodiments, a first direction D1, a second direction D2, and a third direction D3 are used for purposes of description. The first direction D1 is a direction from the drain electrode E1 to the semiconductor layer SL. The second direction D2 is a direction perpendicular to the first direction D1. The third direction D3 is a direction that is perpendicular to the first direction D1 and is inclined to the second direction D2. The third direction D3 is different from and not perpendicular to the second direction D2.

For purposes of the description, the direction from the drain electrode E1 to the semiconductor layer SL is referred to as "upward", and a direction opposite to the direction is referred to as "downward". The directions are based on a relative positional relationship between the drain electrode E1 and the semiconductor layer SL, and is not necessarily correlated with the direction of gravity.

As illustrated in FIG. 1, the source electrode E2 and the gate pad E3 are provided on an upper surface of the semiconductor device 100. The source electrode E2 is electrically separated from the gate pad E3. In an embodiment, a side of the semiconductor layer SL corresponding to the upper surface may be referred to as a first side.

As illustrated in FIGS. 3 and 4, the drain electrode E1 is provided on a lower surface of the semiconductor device 100. In an embodiment, a side of the semiconductor layer SL corresponding to the lower surface may be referred to as a second side. The semiconductor layer SL is provided above the drain electrode E1. The semiconductor layer SL includes (or primarily consists of) single crystal silicon. The second direction D2 corresponds to (or may be referred to as along) a [100] direction of a crystal plane of the single crystal silicon. The source electrode E2 and the gate pad E3 are provided on the semiconductor layer SL.

The semiconductor layer SL includes an n⁻-type (first conductive type) drift region 1 (a first semiconductor region), a p-type (second conductive type) base region 2 (a second semiconductor region), an n⁺-type source region 3 (a third semiconductor region), a p⁺-type contact region 4, and an n⁺-type drain region 5. The semiconductor device 100 also includes a plurality of gate electrodes 10, and an array of structures 20 corresponding to the gate electrodes 10, respectively.

The n⁺-type drain region 5 is provided on the drain electrode E1, and is electrically connected to the drain region E1. The n⁻-type drift region 1 is provided on the n⁺-type drain region 5, and is electrically connected to the drain electrode E1 through the n⁺-type drain region 5. The p-type base region 2 is provided on the n⁻-type drift region 1. The n⁺-type source region 3 and the p⁺-type contact region 4 are provided on the p-type base region 2.

Each of the structures 20 includes an insulating portion 21 and a conductive portion 22. The insulating portion 21 is adjacent to a part of the n⁻-type drift region 1, the p-type base region 2, and the n⁺-type source region 3 in the second direction D2 and the third direction D3. The conductive portion 22 is provided in the insulating portion 21. At least a part of the conductive portion 22 is adjacent to a part of the n⁻-type drift region 1 in the second direction D2 and the third direction D3.

The gate electrode 10 is also provided in the insulating portion 21 of the semiconductor device 100. The gate electrode 10 is provided around an upper part of the conductive portion 22 in the second direction D2 and the third direction D3. Between the gate electrode 10 and the conductive portion 22, a part of the insulating portion 21 is provided. Therefore, the gate electrode 10 is electrically separated from the conductive portion 22.

The gate electrode 10 faces the p-type base region 2 through a gate insulating layer 11 in the second direction D2 and the third direction D3. The gate electrode 10 may further face the n⁻-type drift region 1 and the n⁺-type source region 3 through the gate insulating layer 11. In the semiconductor device 100, a part of the insulating portion 21 functions as the gate insulating layer 11.

As illustrated in FIG. 2, a plurality of gate electrodes 10 is arranged in the second direction D2 and the third direction D3, and a plurality of structures 20 is arranged in the second direction D2 and the third direction D3. The arrangement of the gate electrodes 10 and the arrangement of the structures 20 may be in a regular manner. For example, a continuous p-type base region 2 is provided around the plurality of gate electrodes 10. The n⁺-type source region is one of a plurality of n⁺-type source regions 3 that are provided around the plurality of gate electrodes 10.

As illustrated in FIGS. 3 and 4, the insulating layer 51 is provided on the p-type base region 2, the plurality of n⁺-type source regions 3, the plurality of gate electrodes 10, and the plurality of structures 20. On the insulating layer 51, a gate wiring 30 is provided. On the gate wiring 30 and the insulating layer 51, the insulating layer 52 is provided. On the insulating layer 52, the source electrode E2 and the gate pad E3 are provided.

The source electrode E2 is provided on the p-type base region 2, the plurality of n⁺-type source regions 3, the plurality of gate electrodes 10, and the plurality of structures 20. The n⁺-type source regions 3 and the p⁺-type contact region 4 are electrically connected to the source electrode E2 through a connection part 41. The source electrode E2 is electrically connected to the conductive portion 22 through a connection part 42. The p-type base region 2 is electrically connected to the source electrode E2 through the p⁺-type contact region 4 and the connection part 41. In the semiconductor device 100, a part of the connection part 41 is provided between the n⁺-type source regions 3. The p⁺-type contact region 4 is disposed below the n⁺-type source regions 3.

The gate electrodes 10 are electrically separated from the source electrode E2. The gate electrodes 10 are electrically connected to the gate wiring 30 through a connection part 43. The gate wiring 30 is electrically connected to the gate pad E3. As illustrated in FIG. 2, the gate wiring 30 is one of a plurality of gate wirings 30 that are arranged in the third direction D3. Each of the gate wirings 30 is electrically connected to the plurality of gate electrodes 10 arranged in the second direction D2 through a plurality of connection parts 43.

Figure 5:
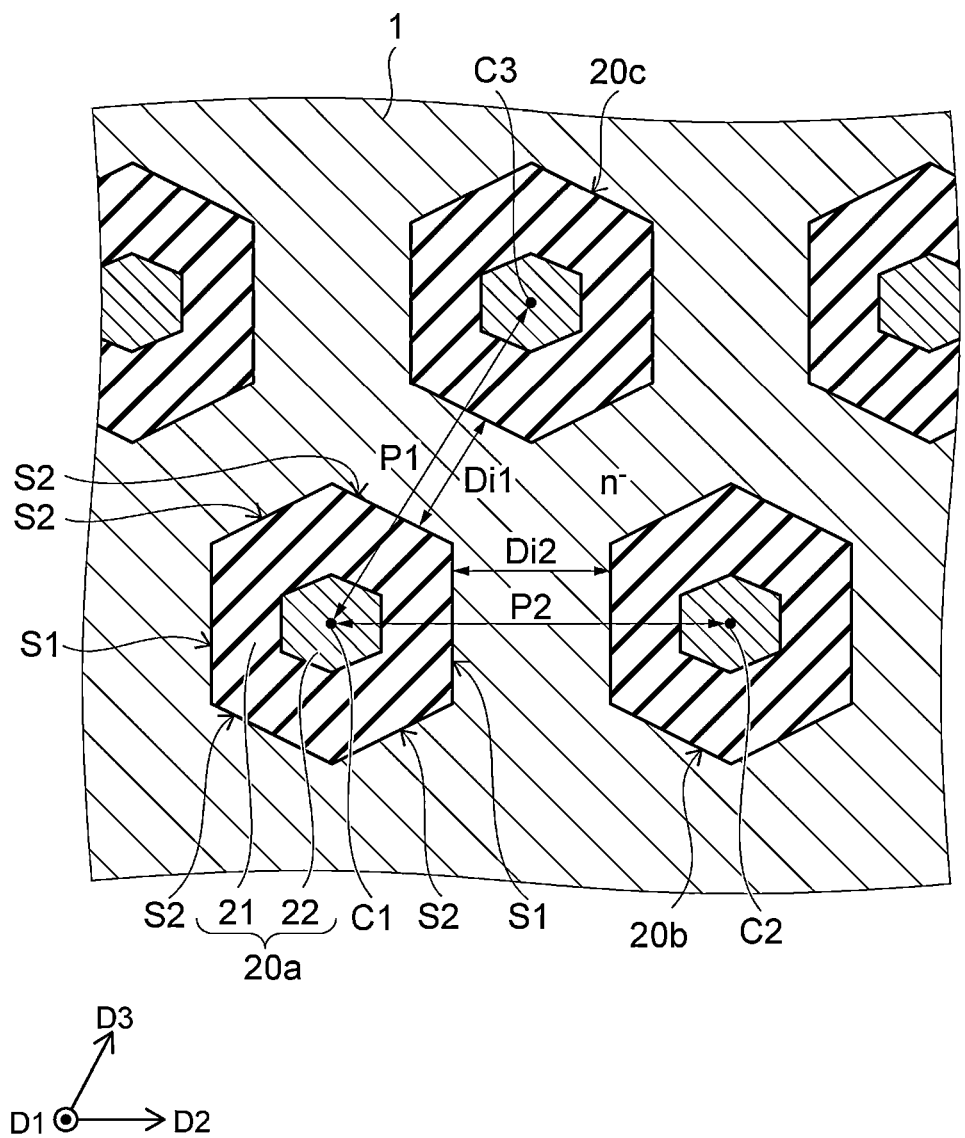
FIG. 5 is a cross-sectional view of a part of a semiconductor device according to a first embodiment.
Figure 6:
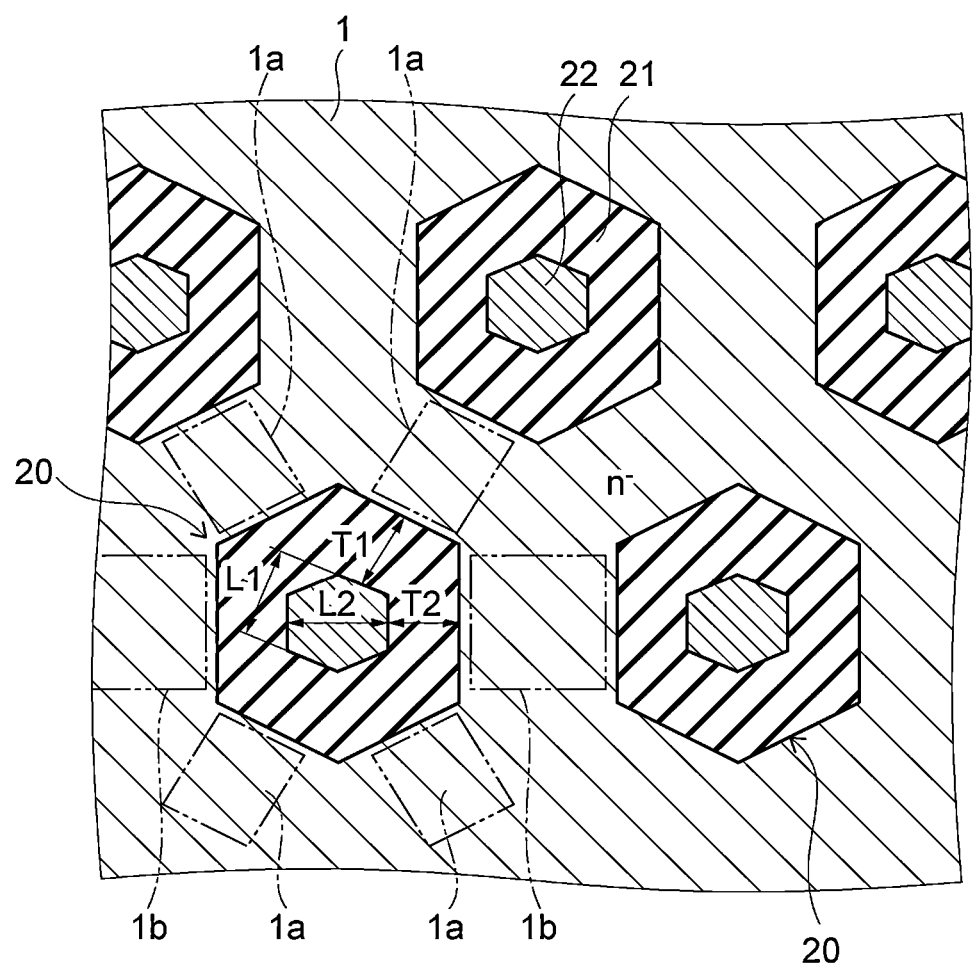
FIG. 6 is another cross-sectional view of a part of a semiconductor device according to a first embodiment.
Figure 6:
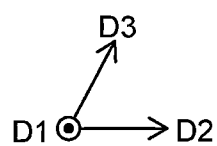

FIGS. 5 and 6 are cross-sectional views illustrating a part of the semiconductor device according to the first embodiment. FIGS. 5 and 6 represent a part of cross-sectional views of FIGS. 3 and 4 taken along a line V-V.

As illustrated in FIG. 5, the semiconductor device have a first surface S1 that is perpendicular to the second direction D2 and a second surface S2 that is inclined to the second direction D2. Specifically, the structures 20 each have a surface that is perpendicular to the [100] direction of a crystal plane of silicon and a surface that is inclined to the [100] direction.

A first distance Di1 between the adjacent structures 20 in the third direction D3 is shorter than a second distance Di2 between the adjacent structures 20 in the second direction D2. A first pitch P1 between the structures 20 in the third direction D3 is shorter than a second pitch P2 between structures 20 in the second direction D2. The first pitch P1 and the second pitch P2 correspond to a distance between centers of the structures 20 in the third direction D3 and the second direction D2, respectively.

As a specific example, the structures 20 include a first structure 20a, a second structure 20b, and a third structure 20c. In FIG. 5, a first center C1 is a center of the first structure 20a in the second direction D2 and the third direction D3. A second center C2 is a center of the second structure 20b in the second direction D2 and the third direction D3. A third center C3 is a center of the third structure 20c in the second direction D2 and the third direction D3. The first pitch P1 corresponds to a distance between the first center C1 and the third center C3 in the third direction D3. The second pitch P2 corresponds to a distance between the first center C1 and the second center C2 in the second direction D2.

As illustrated in FIG. 6, the n⁻-type drift region 1 includes a plurality of first parts 1a and a plurality of second parts 1b. Each of the first parts 1a is disposed between the adjacent structures 20 in the second direction D2. Each of the second parts 1b is disposed between the adjacent structures 20 in the third direction D3. The n-type impurity concentration at the second parts 1b is higher than that at the first parts 1a. In an embodiment, the n-type impurity concentration may be defined as an average value in each part.

A thickness T1 between the n⁻-type drift region 1 and the conductive portion 22 in the third direction D3 is larger than a thickness T2 between the n⁻-type drift region 1 and the conductive portion 22 in the second direction D2. A length L1 of the conductive part 22 in the third direction D3 is shorter than a length L2 of the conductive portion 22 in the second direction D2.

An operation of the semiconductor device 100 will be described.

While a positive voltage is applied to the drain electrode E1 with respect to the source electrode E2, a voltage that is equal to or more than a threshold voltage is applied to the gate electrodes 10. As a result, a channel (inversion layer) is formed on the p-type base region 2, and the semiconductor device 100 is turned on. Electrons flow from the source electrode E2 through the channel to the drain electrode E1. When the voltage applied to the gate electrodes 10 is lower than the threshold voltage, the channel on the p-type base region 2 is eliminated, and the semiconductor device 100 is turned off.

When the semiconductor device 100 is turned off, the positive voltage applied to the drain electrode E1 with respect to the source electrode E2 is increased. That is, a potential difference between the n⁻-type drift region 1 and the conductive portion 22 is increased. Due to such an increase in potential difference, a depletion layer is formed from an interface between the insulating portion 21 and the n⁻-type drift region 1 to the n⁻-type drift region 1. That is, the structures 20 function as a field plate. Due to the formed depletion layer, the pressure resistance of the semiconductor device 100 can be enhanced. While the pressure resistance of the semiconductor device 100 is maintained, the n-type impurity concentration at the n⁻-type drift region 1 can be increased, and the on resistance of the semiconductor device 100 can be decreased.

An example of a material of each component of the semiconductor device 100 will be described.

The n⁻-type drift region 1, the p-type base region 2, the n⁺-type source regions 3, the p⁺-type contact region 4, and the n⁺-type drain region 5 contain silicon as a semiconductor material. Specifically, these semiconductor regions may be primarily formed of single crystal having a diamond structure.

The gate electrodes 10 and the conductive portion 22 contain a conductive material such as polysilicon. The conductive material may contain an impurity. The insulating portion 21, the insulating layer 51, and the insulating layer 52 contain an insulating material. For example, the insulating portion 21, the insulating layer 51, and the insulating layer 52 contain silicon oxide or silicon nitride. The drain electrode E1, the source electrode E2, and the gate pad E3 contain a metal such as aluminum or copper. The connection parts 41 to 43 contain a metal such as tungsten, aluminum, or copper.

An example of a method for manufacturing the semiconductor device 100 according to the first embodiment will be described.

FIGS. 7A to 10B are cross-sectional views illustrating a process of manufacturing the semiconductor device according to the first embodiment. FIGS. 7A to 10B represent the cross-sectional surface that is perpendicular to the second direction D2 in the manufacturing process.

Figure 7A:
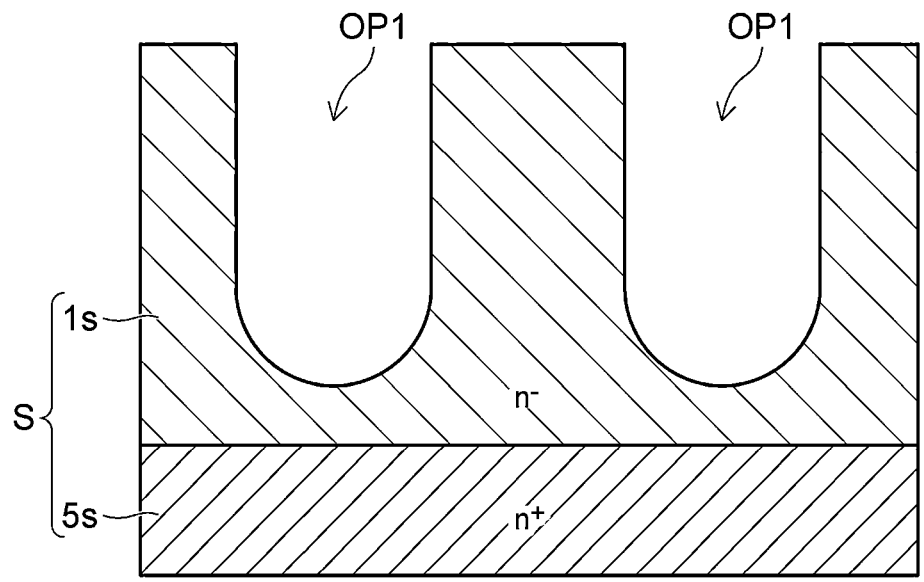
FIGS. 7A and 7B are cross-sectional views illustrating aspects of a process of manufacturing a semiconductor device according to the first embodiment.

A semiconductor substrate S including an n⁺-type semiconductor layer 5s and an n⁻-type semiconductor layer 1s is prepared. The n⁻-type semiconductor layer 1s is provided on the n⁺-type semiconductor layer 5s. The semiconductor substrate S contains single crystal silicon. A part of the n⁻-type semiconductor layer 1s is removed to form an opening OP1 as illustrated in FIG. 7A. In the second direction D2 and the third direction D3, a plurality of openings OP1 are formed. Apart of the n⁻-type semiconductor layer 1s is disposed between the adjacent openings OP1 in the third direction D3. Another part of the n⁻-type semiconductor layer 1s is disposed between the adjacent openings OP1 in the second direction D2.

An insulating layer IL1 is formed along an interior surface of the plurality of openings OP1 and an upper surface of the n⁻-type semiconductor layer 1s by thermal oxidation. At that time, a difference in oxidation rate is caused according to the crystal orientation of silicon. Specifically, the oxidation rate on a surface that is perpendicular to a [100] direction of crystal surface of silicon is lower than that on a surface that is inclined to the [100] direction. In single crystal silicon, the [010] direction is equal to the [100] direction. Therefore, the oxidation rate is decreased on the surface that is perpendicular to the [100] direction and the surface that is perpendicular to the [010] direction. In the present disclosure, the [100] direction and the [010] direction are collectively referred to as [100] direction.

In the insulating layer IL1 formed along the interior surface of the openings OP1, the thickness of the insulating layer IL1 in the third direction D3 is made larger than that of the insulating layer IL1 in the second direction D2 according to a difference in oxidation rate. Therefore, the dimension of the openings OP1 in the third direction D3 is shorter than that of the openings OP1 in the second direction D2. During oxidation, an impurity shifts from oxidized silicon to the n⁻-type semiconductor layer 1s. According to the difference in oxidation rate between crystal orientations, a large amount of impurity shifts to the part of the n⁻-type semiconductor layer 1s as compared with the other part of the n⁻-type semiconductor layer 1s. As a result, the n-type impurity concentration at the part of the n⁻-type semiconductor layer 1s is higher than that at the other part of the n⁻-type semiconductor layer 1s.

Figure 7B:
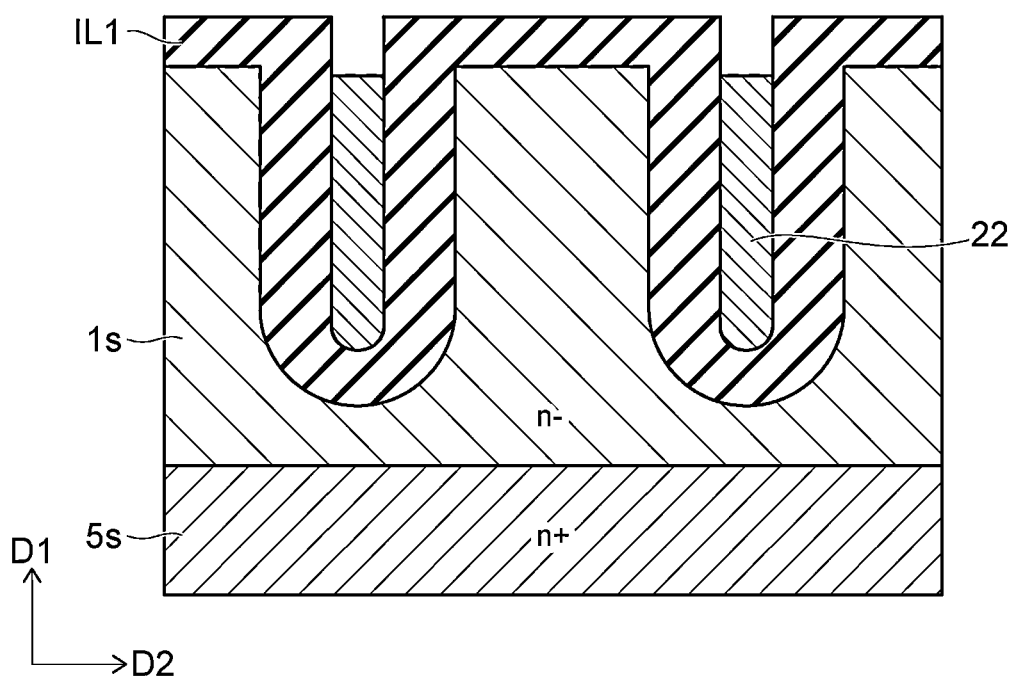

On the insulating layer IL1, a conductive layer is formed so as to be embedded in the plurality of openings OP1. For example, the conductive layer contains polysilicon containing an impurity. An upper surface of the conductive layer is recessed, and as illustrated in FIG. 7B, the conductive portion 22 is formed inside each of the openings OP1.

Figure 8A:
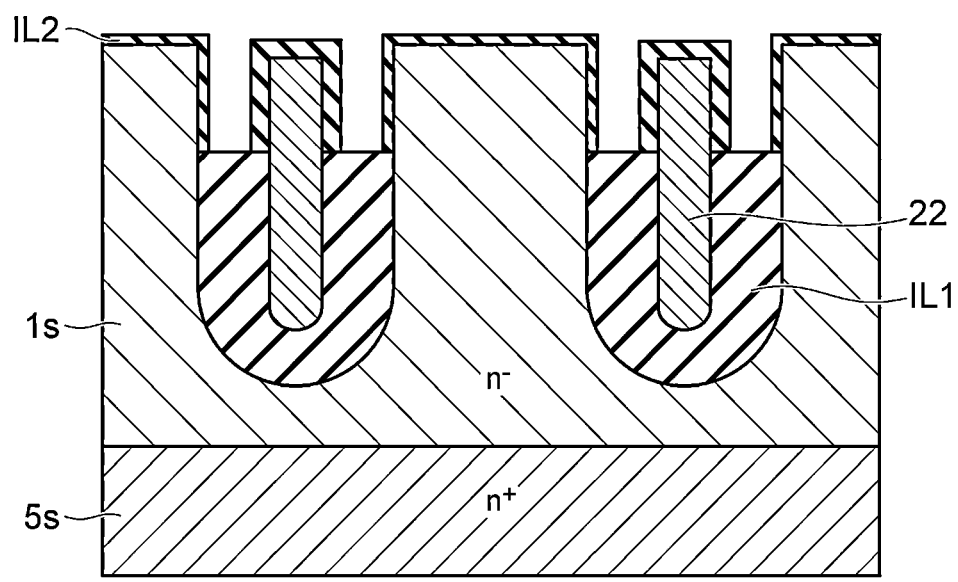
FIGS. 8A and 8B are cross-sectional views illustrating aspects of a process of manufacturing a semiconductor device according to the first embodiment.

The insulating layer IL1 that is provided around an upper part of the conductive portion 22 and an upper surface of the n-type semiconductor layer 1s is removed. As a result, the upper part of the conductive portion 22 and the upper surface of the n⁻-type semiconductor layer 1s are exposed. By thermal oxidation, an insulating layer IL2 is formed along an exposed part as illustrated in FIG. 8A.

Figure 8B:
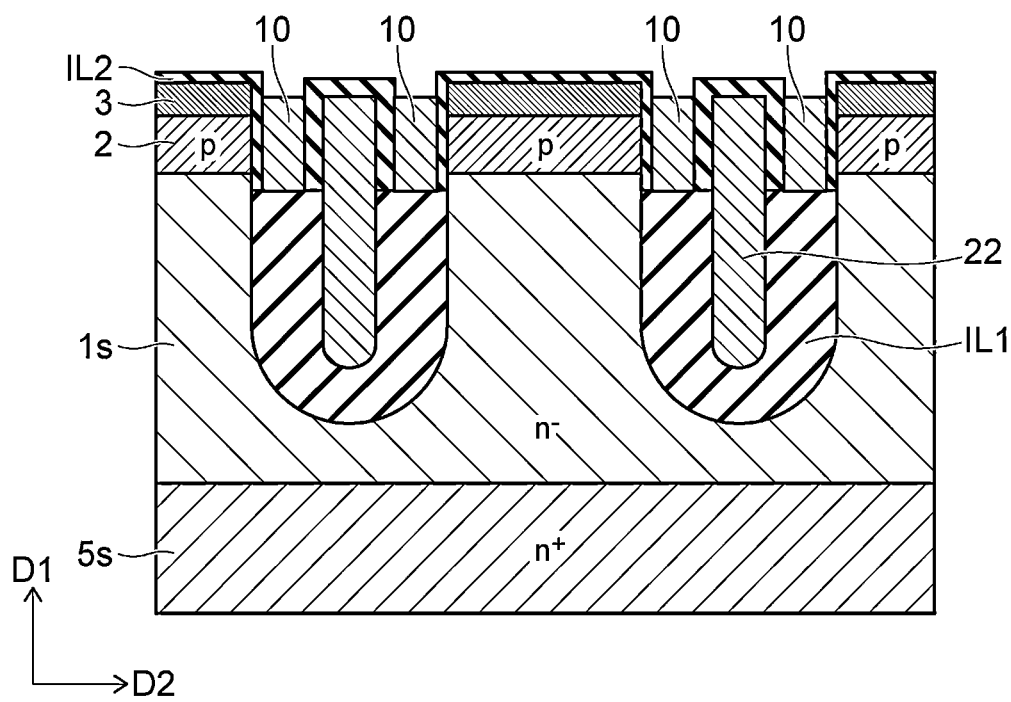

A conductive layer containing polysilicon is formed on the insulating layer IL2, and an upper surface of the conductive layer is recessed. As a result, the gate electrodes 10 are formed around an upper part of each of the conductive parts 22. A surface of the n⁻-type semiconductor layer 1s is subjected to ion implantation with a p-type impurity, to form the p-type base region 2. A surface of the p-type base region 2 is subjected to ion implantation with an n-type impurity, to form the n⁺-type source region 3, as illustrated in FIG. 8B.

Figure 9A:
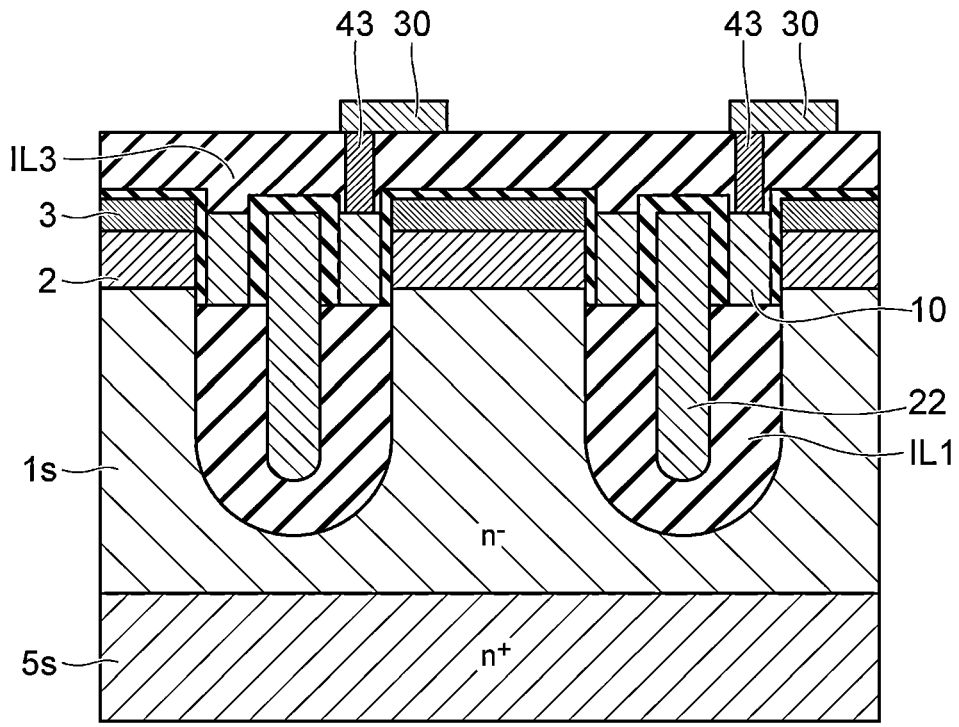
FIGS. 9A and 9B are cross-sectional views illustrating aspects of a process of manufacturing a semiconductor device according to the first embodiment.

On the insulating layer IL2 and the plurality of gate electrodes 10, an insulating layer IL3 is formed, and an upper surface of the insulating layer IL3 is made flat. A plurality of openings are formed so as to penetrate the insulating layer IL3 and reach the gate electrodes 10. A metal layer containing tungsten is formed, and embedded in each of the openings. An upper surface of the metal layer is recessed, to form each connection part 43 that is connected to each of the plurality of gate electrodes 10. A metal layer containing aluminum is formed on the insulating layer IL3 and the plurality of the connection parts 43, and patterned. As a result, the gate wirings 30 that are connected to the connection parts 43 are formed as illustrated in FIG. 9A.

Figure 9B:
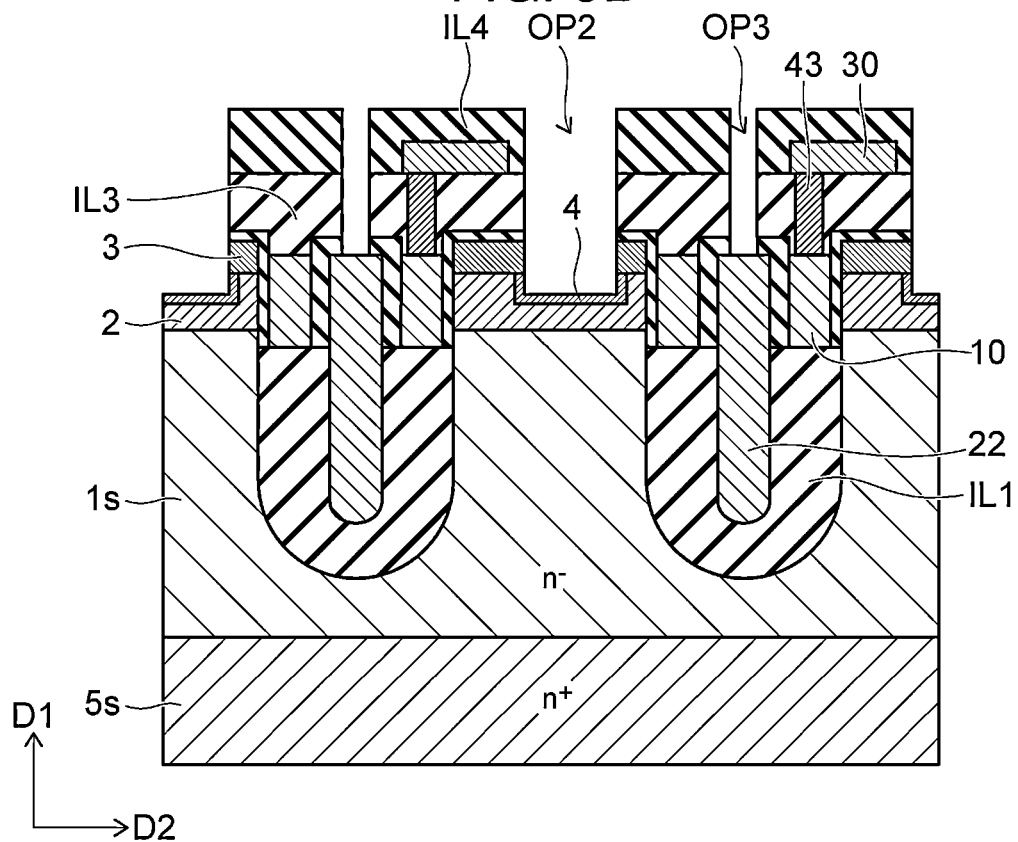

On the insulating layer IL3, an insulating layer IL4 is formed so as to cover the plurality of the gate wirings 30, and an upper surface of the insulating layer IL4 is made flat. Apart of each of the insulating layer IL3, the insulating layer IL4, and the p-type base region 2, and the n⁺-type source region 3 is removed. As a result, an opening OP2 that reaches the p-type base region 2 and an opening OP3 that reaches each of the conductive parts 22 are formed. The openings are provided at a position where the gate wirings 30 are not provided. The p-type base region 2 is subjected to ion implantation with a p-type impurity through the opening OP2, to form the p⁺-type contact region 4 as illustrated in FIG. 9B.

Figure 10A:
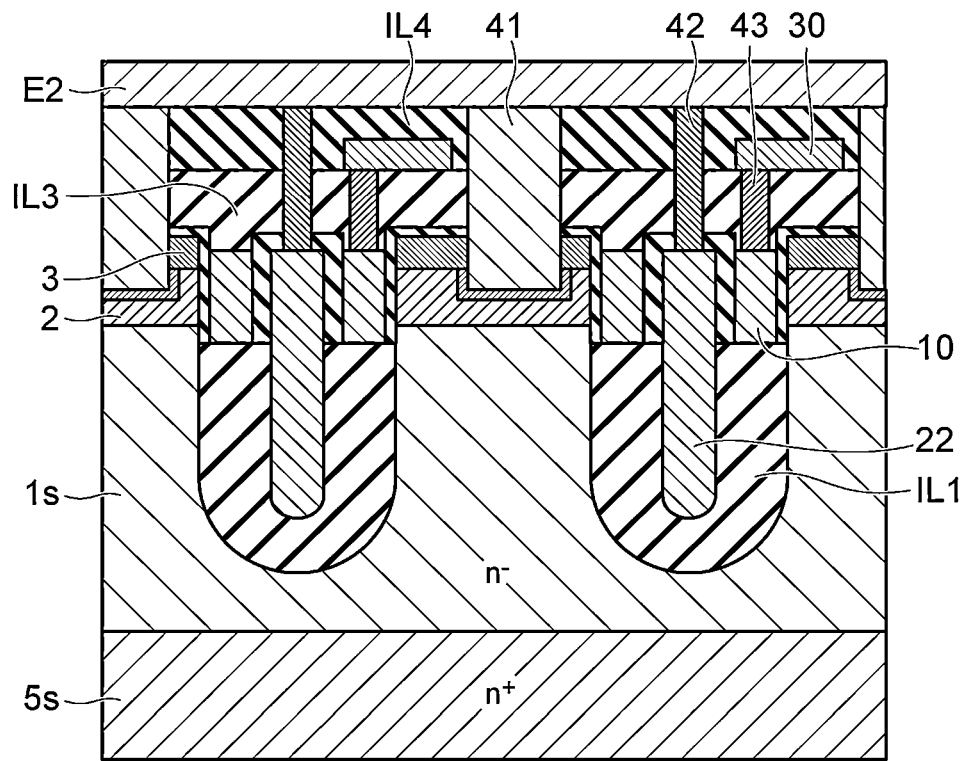
FIGS. 10A and 10B are cross-sectional views illustrating aspects of a process of manufacturing a semiconductor device according to the first embodiment.

A metal layer containing tungsten is formed, and embedded in each of the openings. An upper surface of the metal layer is recessed, to form the connection part 41 that is electrically connected to the p⁺-type contact region 4 and the connection part 42 that is electrically connected to each of the conductive parts 22. On the insulating layer IL4, a metal layer containing aluminum is formed, and patterned. The source electrode E2 and the gate pad E3, which are not shown in the drawing, are formed as illustrated in FIG. 10A. The source electrode E2 is electrically connected to a plurality of connection parts 41 and a plurality of connection parts 42.

Figure 10B:
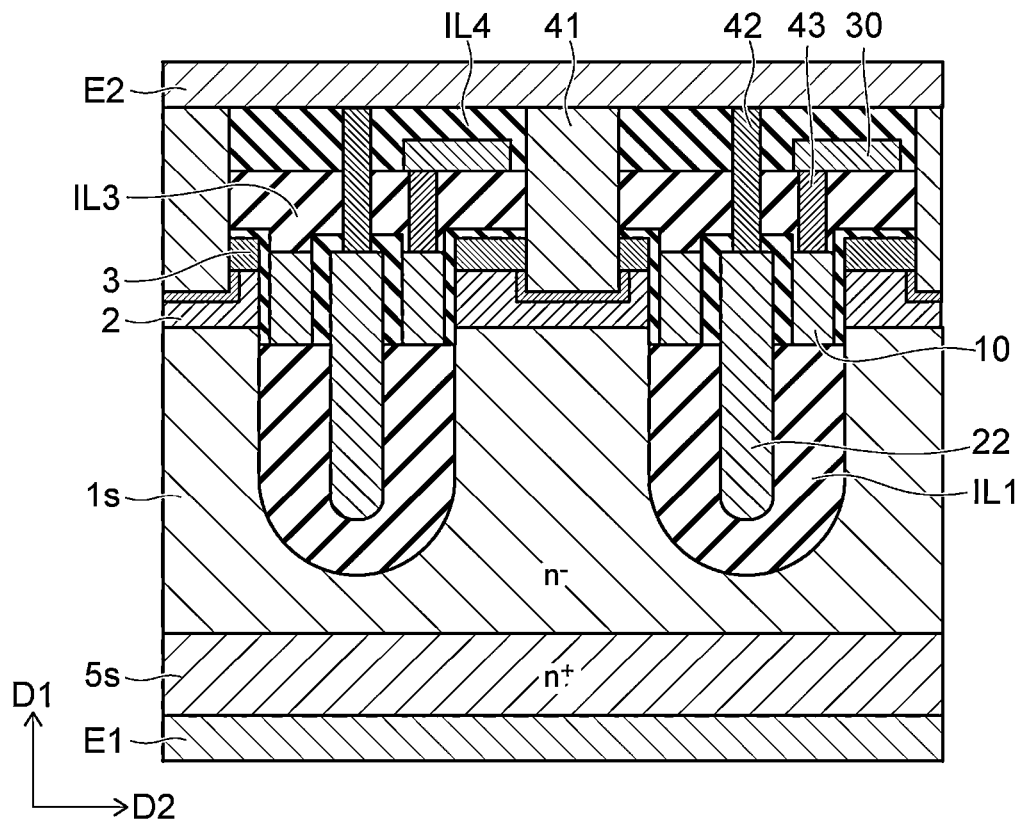

A back surface of the n⁺-type semiconductor layer 5s is ground until the thickness of the n⁺-type semiconductor layer 5s is a predetermined thickness. After then, the drain electrode E1 is formed on the back surface of the n⁺-type semiconductor layer 5s, as illustrated in FIG. 10B. As a result, the semiconductor device 100 illustrated in FIGS. 1 to 6 is manufactured.

In the manufacturing process, chemical vapor deposition (CVD) or sputtering may be used for formation of each component. To remove a part of each component, wet etching, chemical dry etching (CDE), or reactive ion etching (RIE) may be used. In recessing or flattening an upper surface of each component, wet etching, CDE, or chemical mechanical polishing (CMP) may be used.

Effects of the first embodiment will be described.

In the semiconductor device 100, the plurality of structures 20 that function as a field plate are provided in the second direction D2 and the third direction D3. According to the configuration, the volume of the n⁻-type drift region 1 that is a current route can be increased as compared with a case where the structures 20 are extended in one direction. Therefore, the on resistance of the semiconductor device 100 can be decreased.

In the semiconductor device 100, the plurality of gate electrodes 10 are provided in the second direction D2 and the third direction D3. According to the configuration, a channel is formed at a larger number of regions as compared with a case where the gate electrodes 10 are extended in one direction. The channel density is improved, and the on resistance of the semiconductor device 100 is further decreased.

For example, when the on resistance of the semiconductor device 100 is decreased, the density of current that flows in the semiconductor device 100 can be improved. Due to the improved current density, the semiconductor device 100 can be miniaturized. Further, the number of semiconductor device 100 required to supply a predetermined current can be decreased.

As described in the method, a difference in oxidation rate of silicon is caused according to the crystal orientation. Specifically, the oxidation rate in a [100] orientation direction of a crystal plane of silicon is lower than that in a direction that is inclined to the [100] direction. Due to the difference in oxidation rate, for example, distribution of the n-type impurity concentration occurs at the n-type drift region 1. That is, the n-type impurity concentration at the second parts 1b that are adjacent to the structures 20 in the third direction D3 is higher than that at the first parts 1a that are adjacent to the structures 20 in the second direction D2. As described above, due to the difference in oxidation rate caused according to the orientation of silicon crystal plane, the thickness T1 of the insulating portion 21 in the third direction D3 is larger than the thickness T2 of the insulating portion 21 in the second direction D2. Due to distributions of thickness of the insulating portion 21 and the n-type impurity concentration, the depletion layer is unlikely to be formed in the third direction D3 when a positive voltage is applied to a drain electrode with the semiconductor device 100 turned off.

A reference example of the semiconductor device includes a semiconductor device in which the distance between structures in the second direction D2 is the same as that in the third direction D3. In the semiconductor device of the reference example, it is necessary that the impurity concentration at the n⁻-type drift region 1 be decreased to prevent a decrease in pressure resistance. When the impurity concentration at the n⁻-type drift region 1 is decreased, formation of the depletion layer in the third direction D3 is improved. In this case, the on resistance of the semiconductor device is, however, increased.

In the semiconductor device 100 according to the first embodiment, the first distance Di1 between the adjacent structures 20 in the third direction D3 is shorter than the second distance Di2 between the adjacent structures 20 in the second direction D2, as illustrated in FIG. 5. When the first distance Di1 is shorter than the second distance Di2, the n⁻-type drift region 1 that is disposed between the structures 20 in the third direction D3 is easily depleted. A decrease in pressure resistance due to a difference in spread of the depletion layer in the second direction D2 and the third direction D3 can be prevented.

When the first distance Di1 and the second distance Di2 are adjusted, the pressure resistance can be maintained. Therefore, it is not necessary that the n-type impurity concentration at the n⁻-type drift region 1 be decreased. According to the first embodiment, the n-type impurity concentration at the n⁻-type drift region 1 can be increased, and the on resistance of the semiconductor device 100 can be decreased as compared with the reference example.

Figure 11A:
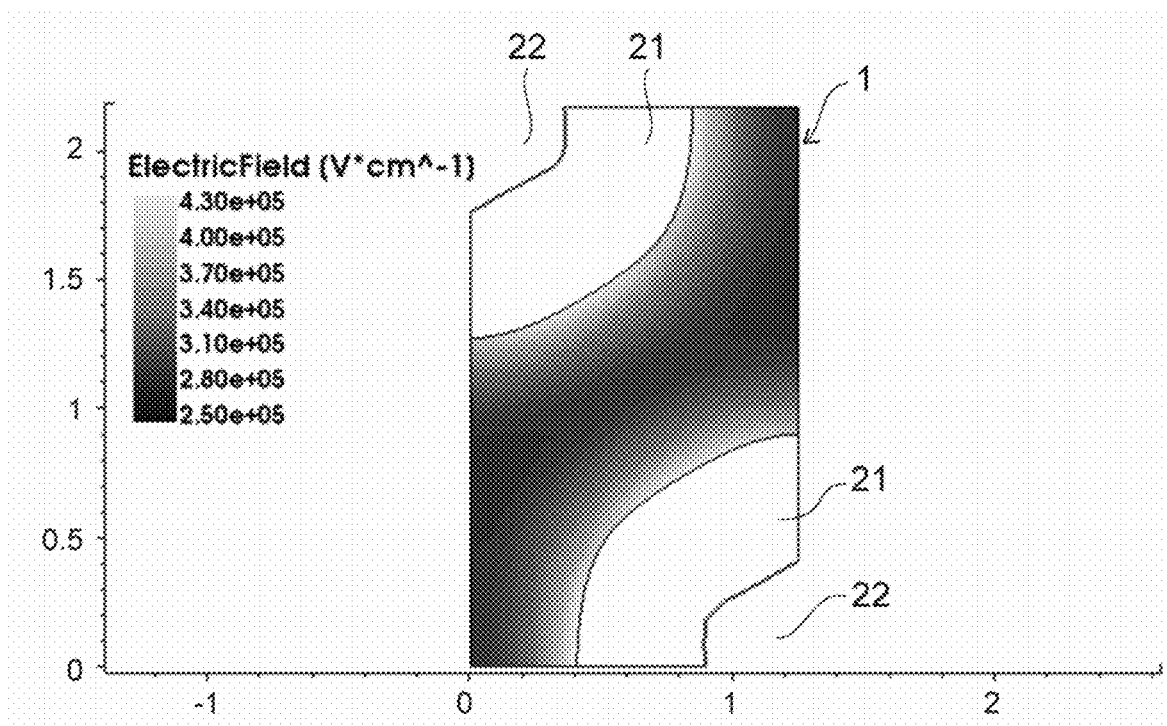
FIGS. 11A and 11B depict simulation results illustrating properties of a semiconductor device according to a reference example and a semiconductor device according to the first embodiment, respectively.
Figure 11B:
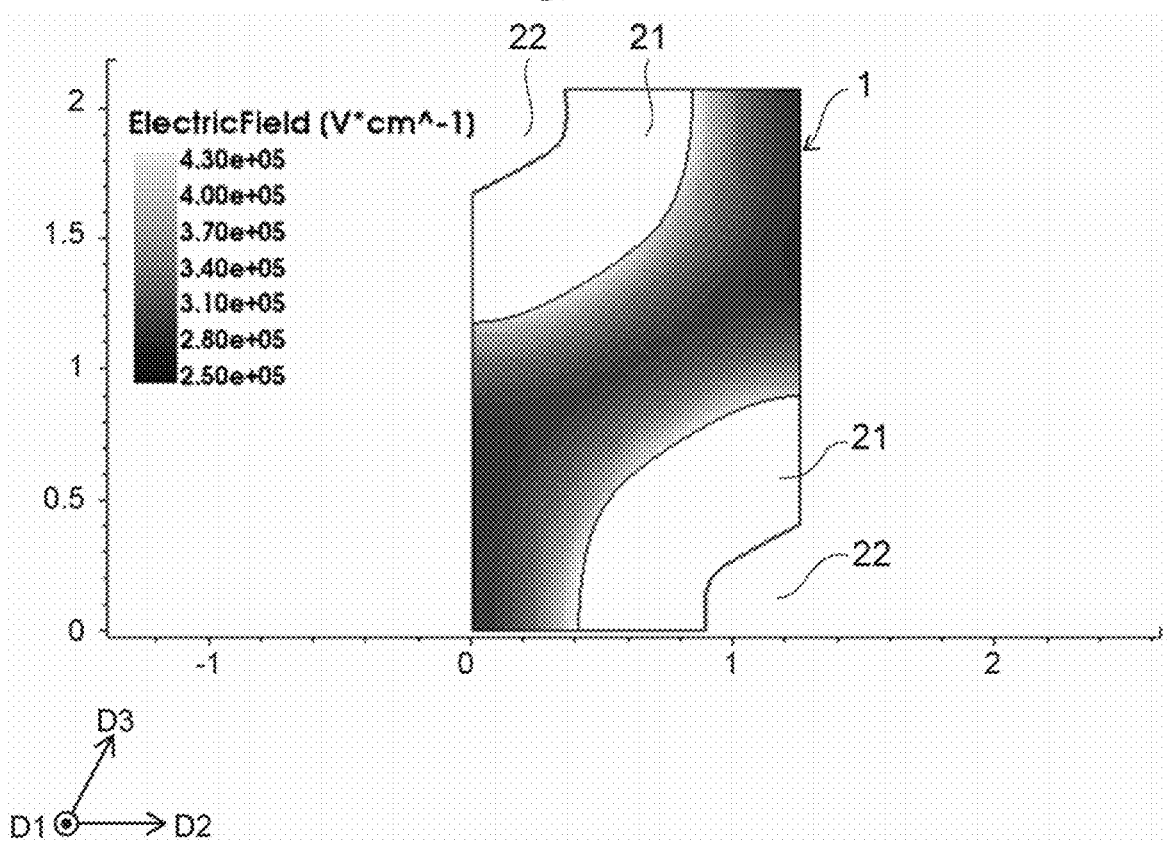

FIGS. 11A and 11B show simulation results illustrating properties of the semiconductor device according to the reference example and the semiconductor device according to the first embodiment, respectively.

FIG. 11A shows the properties of the semiconductor device according to the reference example. FIG. 11B shows the properties of the semiconductor device 100 according to the first embodiment.

FIGS. 11A and 11B shows an electric field strength at each point of the n⁻-type drift region 1 that is disposed between the structures 20. In the semiconductor device according to the reference example, distribution of the electric field strength is caused by the distribution of n-type impurity concentration at the n⁻-type drift region 1, as illustrated in FIG. 11A. In the semiconductor device 100 according to the first embodiment, when the first distance Di1 is shorter than the second distance Di2, the n⁻-type drift region 1 disposed between the structures 20 is easily depleted. Accordingly, the distribution of electric field strength is improved as illustrated in FIG. 11B.

In order to make the first distance Di1 shorter than the second distance Di2, for example, the first pitch P1 is made shorter than the second pitch P2, as illustrated in FIG. 5. When the first pitch P1 is made shorter than the second pitch P2, the density of the structures 20 in the third direction D3 can be improved. That is, the channel density can be improved. Therefore, the on resistance of the semiconductor device 100 can be further decreased.

For example, the ratio of the n-type impurity concentration at the second part 1b to the n-type impurity concentration at the first part 1a is 0.7 or more and 0.95 or less. From the viewpoint of pressure resistance and on resistance, the ratio of the first distance Di1 to the second distance Di2 is preferably 0.5 or more and 0.95 or less. The ratio of the second pitch P2 to the first pitch P1 is 0.7 or more and 0.98 or less.

In the semiconductor device 100, the structures 20 each have a hexagonal shape when viewed in the first direction D1. The plurality of structures 20 are arranged in a honeycomb shape, which is the densest, on a plane that is perpendicular to the first direction D1. When the hexagonal structures 20 are the most densely arranged, the width of the n⁻-type drift region 1 that is disposed between the structures 20 can be made uniform. Therefore, the pressure resistance of the semiconductor device 100 can be further improved.

While the pressure resistance of the semiconductor device 100 is maintained, the concentration of n-type impurity at the n⁻-type drift region 1 can be increased, and the on resistance of the semiconductor device 100 can be decreased.

The gate electrodes 10 are provided in the insulating portion 21 of the semiconductor device 100. When the density of the structures 20 is improved, the channel density is also improved. Therefore, the on resistance of the semiconductor device 100 can be further decreased. In each of the structures 20, the conductive portion 22 has a hexagonal shape and the insulating portion 21 has a hexagonal loop shape. Each of the gate electrodes 10 has a hexagonal loop shape.

(First Modification)

Figure 12:
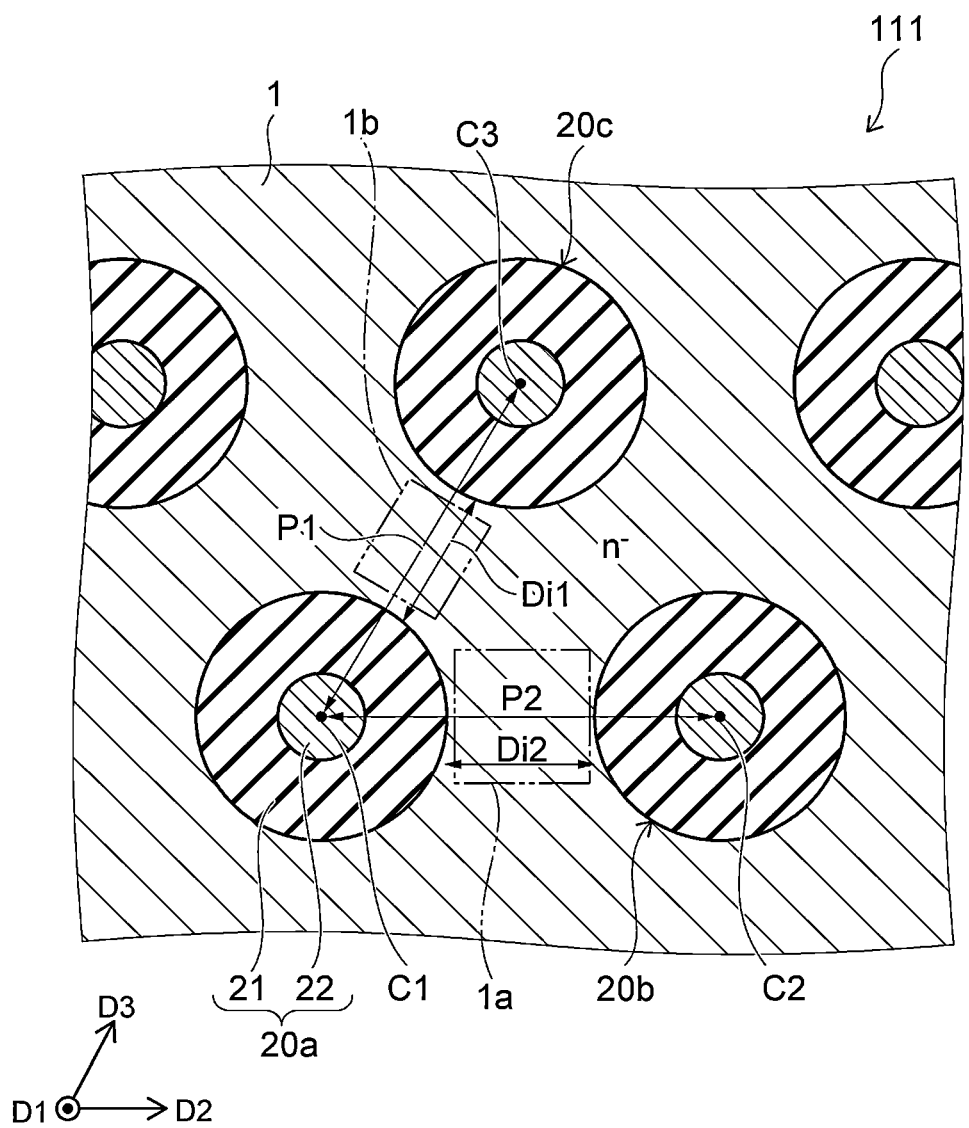
FIG. 12 is a plan view of a part of a semiconductor device according to a first example of a first modification of the first embodiment.
Figure 13:
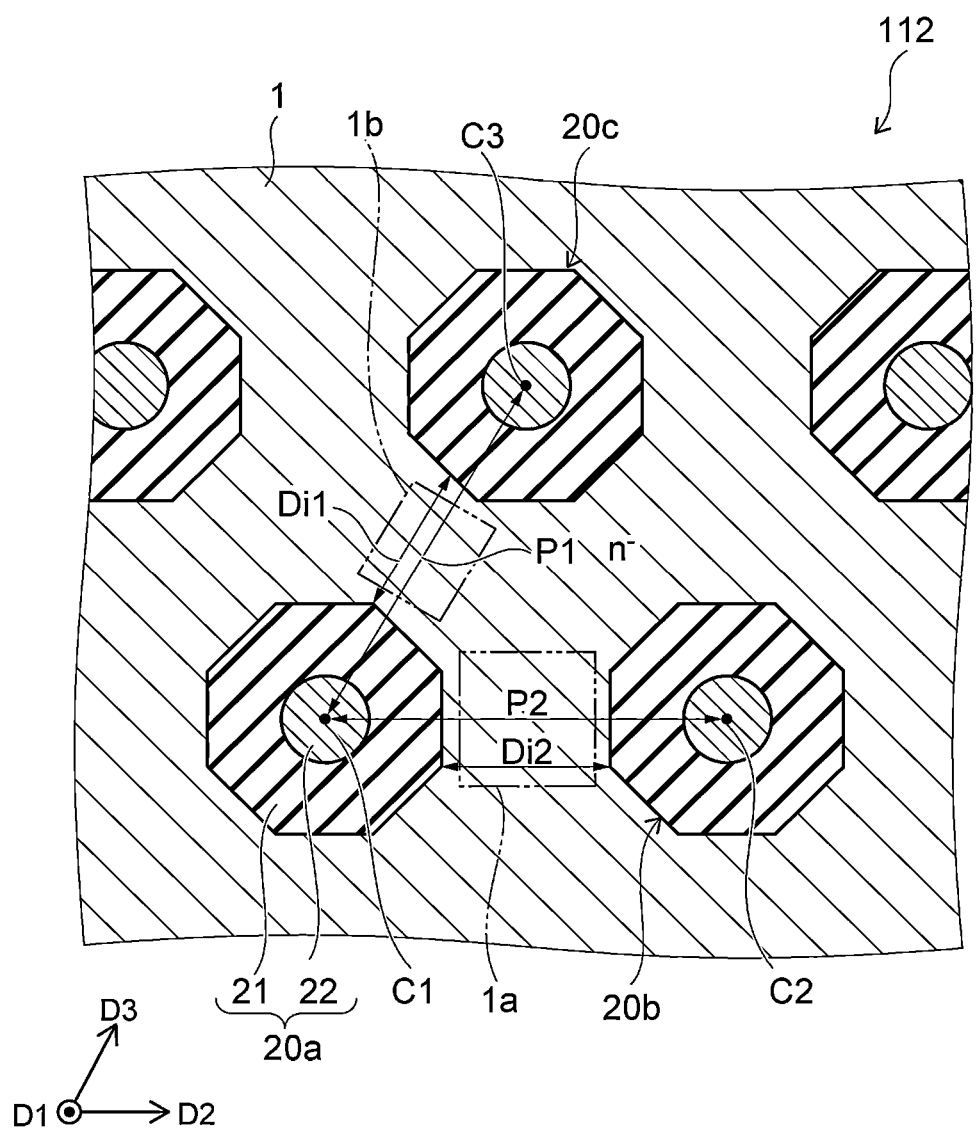
FIG. 13 is a plan view of a part of a semiconductor device according to a second example of a first modification of the first embodiment.

FIGS. 12 and 13 are cross-sectional views of examples of a part of a semiconductor device according to a first modification of the first embodiment.

In a semiconductor device 111 of FIG. 12, the structures 20 have a circular shape when viewed in the first direction D1. In a semiconductor device 112 of FIG. 13, the structures 20 have an octagonal shape when viewed in the first direction D1. Also in the semiconductor devices according to the modification, the oxidation rate in a [100] direction of crystal plane of silicon is lower than that in a direction that is inclined to the [100] direction during the manufacturing process. As a result, distribution of the n-type impurity concentration occurs at the n⁻-type drift region 1.

In the semiconductor devices 111 and 112, the first distance Di1 is shorter than the second distance Di2, like the semiconductor device 100. When the first distance Di1 is shorter than the second distance Di2, the pressure resistance of the semiconductor devices 111 and 112 can be maintained, and the on resistance of the semiconductor devices 111 and 112 can be decreased.

For other configurations of the semiconductor devices 111 and 112, the configuration of the semiconductor device 100 may be similarly used. For example, the first pitch P1 is shorter than the second pitch P2 in the semiconductor devices 111 and 112, as illustrated in FIGS. 12 and 13. The n⁻-type drift region 1 includes the first part 1a and the second part 1b. The n-type impurity concentration at the second parts 1b is higher than that at the first parts 1a.

It is more preferable that the structures 20 each have a hexagonal shape when viewed in the first direction D1. This is because the plurality of structures 20 are the most densely arranged when the structures 20 each have a hexagonal shape.

(Second Modification)

Figure 14:
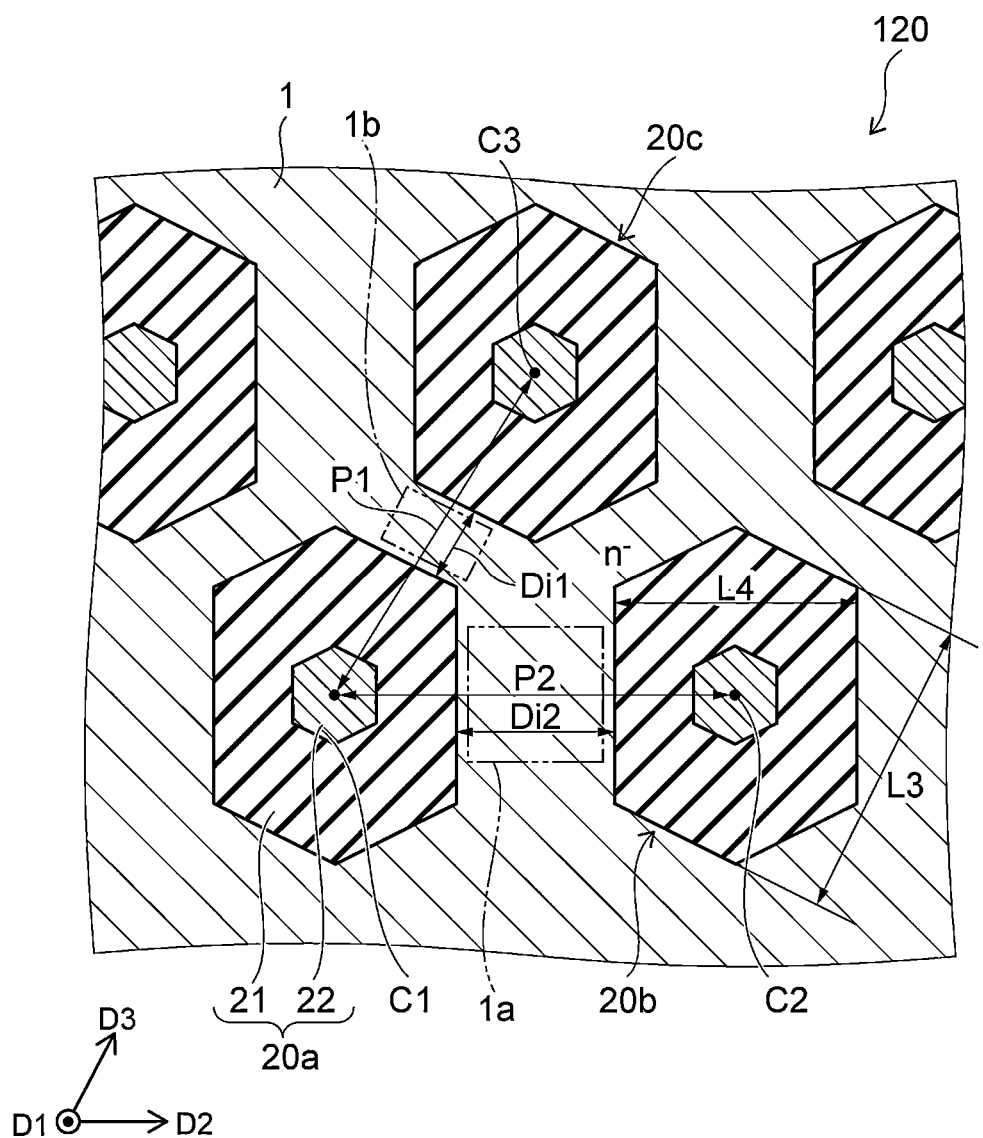
FIG. 14 is a plan view of a part of a semiconductor device according to a second modification of the first embodiment.

FIG. 14 is a plan view of a part of a semiconductor device according to a second modification of the first embodiment.

In a semiconductor device 120 according to the second modification, the first distance Di1 is shorter than the second distance Di2, like the semiconductor device 100. The first pitch P1 is the same as the second pitch P2. A length L3 of the structures 20 in the third direction D3 is shorter than a length L4 of the structures 20 in the second direction D2.

According to the second modification, the pressure resistance of the semiconductor device 120 can be maintained, and the on resistance of the semiconductor device 120 can be decreased, like the semiconductor device 100. It is more preferable that the first pitch P1 be shorter than the second pitch P2, like the semiconductor device 100. When the first pitch P1 is made shorter than the second pitch P2, the density of the structures 20 can be improved. As a result, the channel density can be improved, and the on resistance of the semiconductor device can be further decreased.

For other configurations of the semiconductor device 120, the configuration of the semiconductor device 100 can be similarly used. For example, the n⁻-type drift region 1 includes a plurality of first parts 1a and a plurality of second parts 1b. The n-type impurity concentration at the second parts 1b is higher than that at the first parts 1a.

As described in the modifications, the shape and arrangement of the structures 20 can be appropriately changed. In all the embodiments, when the first distance Di1 is shorter than the second distance Di2, the pressure resistance of the semiconductor device can be maintained, and the on resistance of the semiconductor device can be decreased.

Second Embodiment

Figure 15:
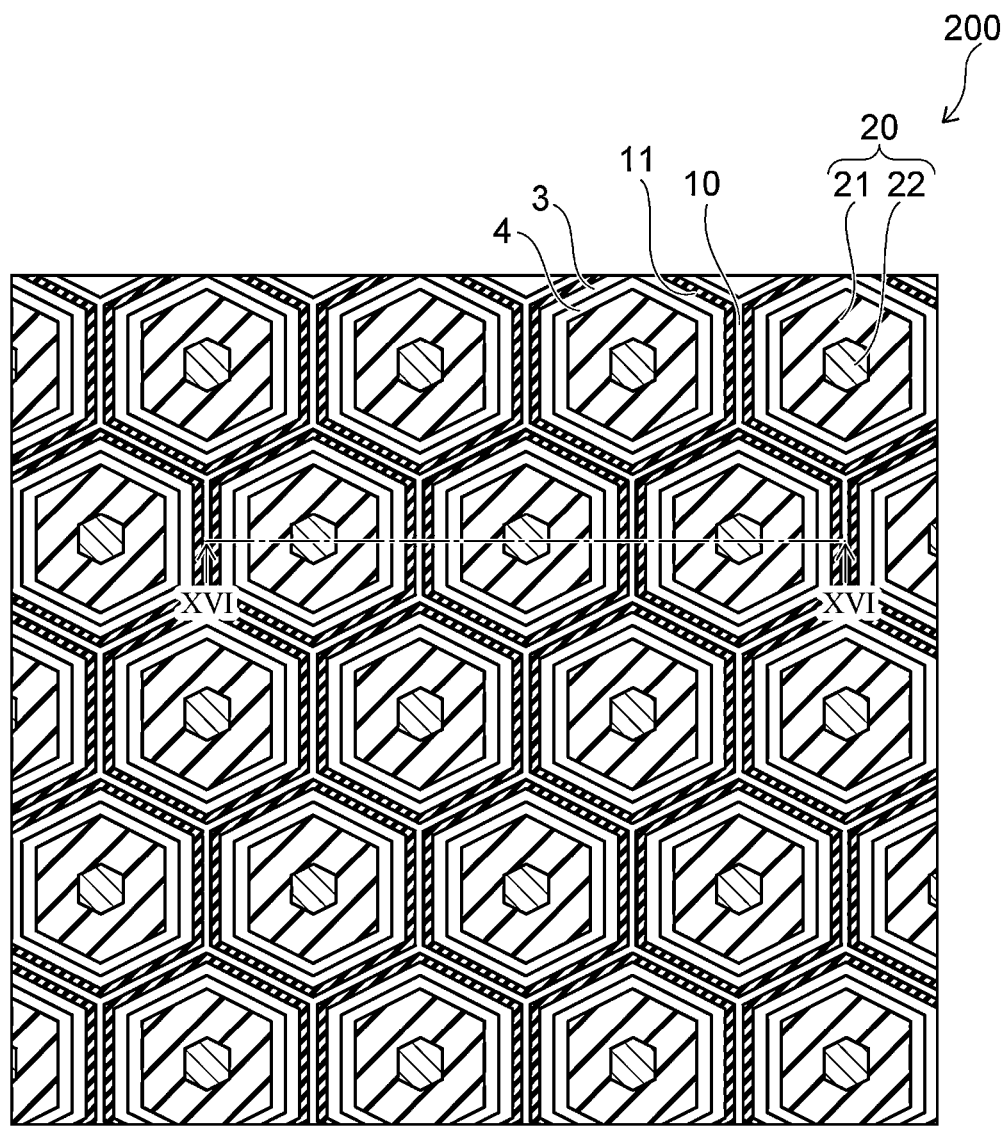
FIG. 15 is a plan view of a part of a semiconductor device according to a second embodiment.

FIG. 15 is a plan view of a part of a semiconductor device according to a second embodiment. In FIG. 15, a source electrode E2, an insulating layer 51, an insulating layer 52, and the like are omitted.

Figure 16:
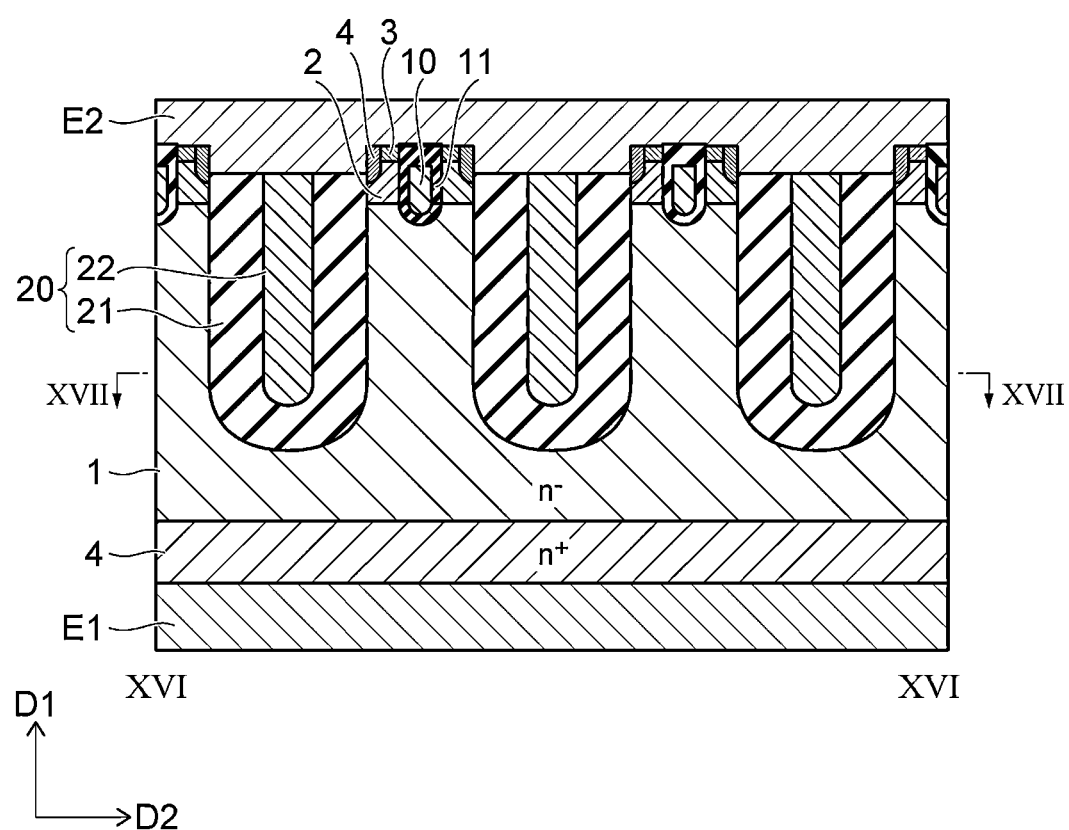
FIG. 16 is a cross-sectional view of a semiconductor device according to a second embodiment taken along a line XVI-XVI in FIG. 15.
Figure 17:
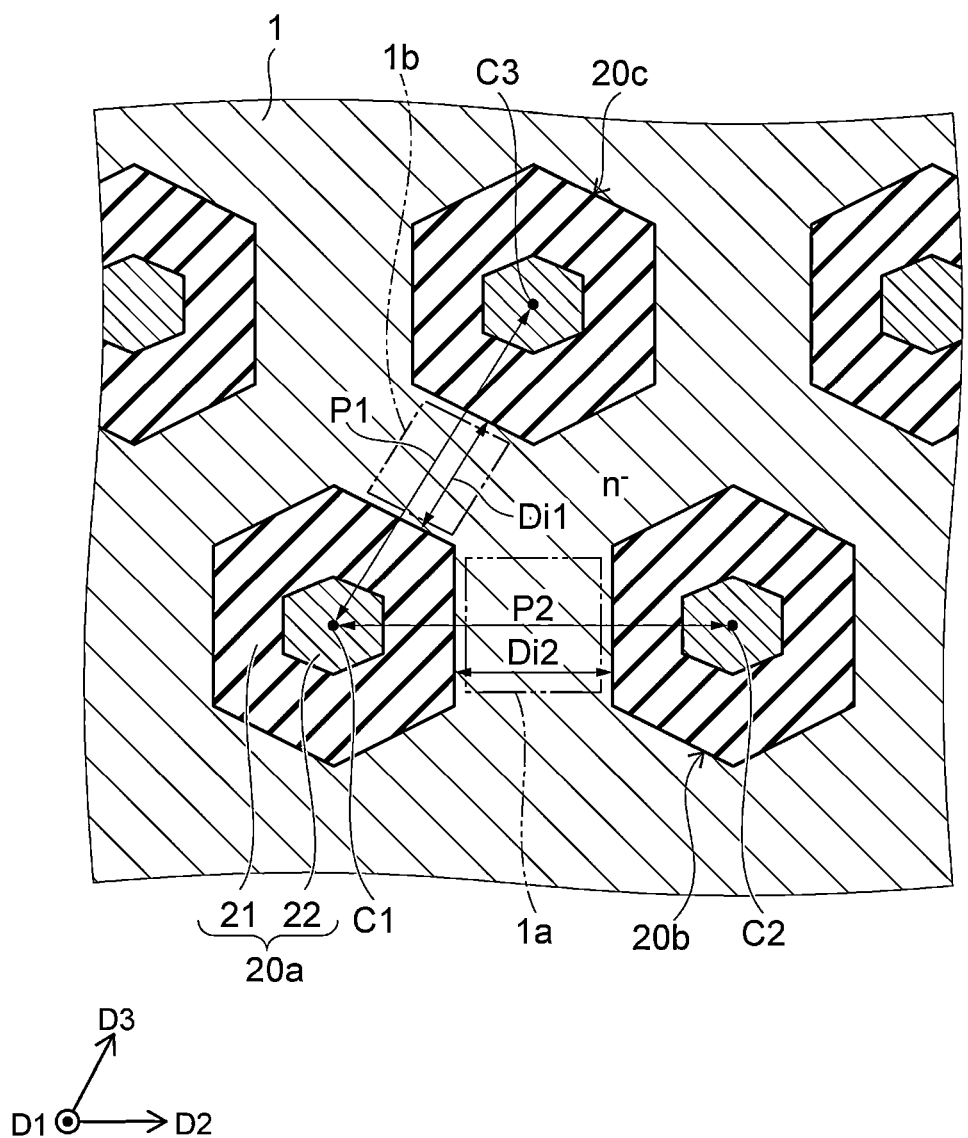
FIG. 17 is a cross-sectional view of a semiconductor device according to a second embodiment taken along a line XVII-XVII in FIG. 16.

FIG. 16 is a cross-sectional view of the semiconductor device according to the second embodiment taken along a line XVI-XVI in FIG. 15. FIG. 17 is a cross-sectional view of the semiconductor device according to the second embodiment taken along a line XVII-XVII in FIG. 16.

In a semiconductor device 200 according to the second embodiment, a gate electrode 10 is separated from the array of structures 20, as illustrated in FIGS. 15 and 16.

As illustrated in FIG. 15, the gate electrode 10 is provided around each of the structures 20. In the cross section depicted in FIG. 15, the gate electrode 10 has a honeycomb shape. As illustrated in FIG. 16, a plurality of p-type base regions 2 are each provided between the gate electrode 10 and the plurality of structures 20 in the second direction D2 and the third direction D3. Each n⁺-type source region 3 and each p⁺-type contact region 4 are provided on each of the p-type base regions 2. The gate electrode 10 faces the p-type base regions 2 through the gate insulating layer 11 in the second direction D2 and the third direction D3.

The source electrode E2 is provided on the plurality of p-type base regions 2, the plurality of n⁺-type source regions 3, the plurality of p⁺-type contact regions 4, the gate electrode 10, and the plurality of structures 20, and are electrically connected to the plurality of p-type base regions 2, the plurality of n⁺-type source regions 3, the plurality of p⁺-type contact regions 4, and the plurality of conductive parts 22.

In the semiconductor device 200 according to the second embodiment, the first distance Di1 is shorter than the second distance Di2, as illustrated in FIG. 17. In this case, the pressure resistance of the semiconductor device 200 can be maintained, and the on resistance of the semiconductor device 200 can be decreased.

Also in the semiconductor device 200, the first pitch P1 is shorter than the second pitch P2. Therefore, the on resistance of the semiconductor device 200 can be further decreased. The n⁻-type drift region 1 includes the first part 1a and the second part 1b. The n-type impurity concentration at the second parts 1b is higher than that at the first parts 1a.

Further, a configuration of the semiconductor device 200 according to the second embodiment may be appropriately combined with the configuration of the semiconductor device according to each modification of the first embodiment. In the semiconductor device 200, the structures 20 may have a circular or octagonal shape when viewed in the first direction D1. The first pitch P1 may be the same as the second pitch P2.

The relatively high or lower degree of the impurity concentration between semiconductor regions in each embodiment described above can be confirmed, for example, by a scanning capacitance microscope (SCM). The carrier concentration at each semiconductor region can be considered to be equal to the concentration of impurity that is activated at the semiconductor region. Therefore, the relatively high or lower degree of the carrier concentration between the semiconductor regions can also be confirmed by SCM. The impurity concentration at the semiconductor region can be measured, for example, by secondary ion mass spectroscopy (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a semiconductor layer having first and second sides opposite to each other in a first direction, the semiconductor layer being single crystal silicon and including a first region of a first conductivity type, a second region of a second conductivity type, and a third region of the first conductivity type in this order in the first direction from the first side to the second side;
   a first electrode on the first side;
   a second electrode on the second side;
   an array of structures formed in the semiconductor layer and arranged in a second direction that is perpendicular to the first direction and along a [100] direction of the single crystal silicon and in a third direction that is perpendicular to the first direction and not perpendicular to the second direction; and
   a plurality of gate electrodes corresponding to the structures, respectively, wherein
   each of the structures includes a conductive portion electrically connected to the second electrode and an insulating portion surrounding the conductive portion, and
   a first distance between a first one of the structures and a second one of the structures adjacent to the first one in the third direction is less than a second distance between the first one and a third one of the structures adjacent to the first one in the second direction.

2. The semiconductor device according to claim 1, wherein
   the array of structures is regularly arranged in the second and third directions, and
   a first pitch of the array in the third direction is less than a second pitch of the array in the second direction.

3. The semiconductor device according to claim 1, wherein
   the array of structures is regularly arranged in the second and third directions, and
   a first pitch of the array in the third direction is equal to a second pitch of the array in the second direction.

4. The semiconductor device according to claim 1, wherein a ratio of the first distance divided by the second distance is in a range of 0.5 to 0.95.

5. The semiconductor device according to claim 1, wherein the conductive portion of the first one of the structures has a first length in the third direction and a second length in the second direction, the first length being less than the second length.

6. The semiconductor device according to claim 1, wherein the first one of the structures has a third length in the third direction and a fourth length in the second direction, the third length being greater than the fourth length.

7. The semiconductor device according to claim 1, wherein
the first region of the semiconductor layer includes a first part between the first one and the second one of the structures and a second part between the first one and the third one of the structures, and
a concentration of a first-conductivity-type impurity in the first part is less than a concentration of the first-conductivity-type impurity in the second part.

8. The semiconductor device according to claim 1, wherein each of the structures has a hexagonal shape in cross section.

9. The semiconductor device according to claim 1, wherein the conductive portion in each of structures has a hexagonal shape in cross section.

10. The semiconductor device according to claim 1, wherein the insulating portion in each of the structures has a hexagonal loop shape in cross section.

11. The semiconductor device according to claim 1, wherein each of the gate electrodes is provided in the insulating portion of a corresponding one of the structures.

12. The semiconductor device according to claim 1, wherein each of the gate electrodes has a hexagonal loop shape in cross section.

* * * * *